United States Patent
Boland et al.

(10) Patent No.: US 7,700,424 B2
(45) Date of Patent: Apr. 20, 2010

(54) METHOD OF FORMING AN EMBEDDED SILICON CARBON EPITAXIAL LAYER

(75) Inventors: John Boland, Scotts Valley, CA (US); Zhiyuan Ye, Cupertino, CA (US); Yihwan Kim, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 12/038,288

(22) Filed: Feb. 27, 2008

(65) Prior Publication Data

US 2009/0215249 A1 Aug. 27, 2009

(51) Int. Cl.
*H01L 21/336* (2006.01)

(52) U.S. Cl. .................. 438/197; 438/272; 438/481; 257/E21.102; 257/E21.182

(58) Field of Classification Search .......... 438/197, 438/270, 272, 481; 257/E21.102, E21.182
See application file for complete search history.

(56) References Cited

U.S. PATENT DOCUMENTS

| | | | |
|---|---|---|---|
| 5,340,754 A * | 8/1994 | Witek et al. ............ 438/156 |
| 6,562,544 B1 | 5/2003 | Cheung et al. |
| 6,764,958 B1 | 7/2004 | Nemani et al. |
| 6,967,072 B2 | 11/2005 | Latchford et al. |
| 7,138,292 B2 | 11/2006 | Mirabedini et al. |
| 2004/0248368 A1 * | 12/2004 | Natzle et al. ............. 438/300 |
| 2005/0064692 A1 * | 3/2005 | Swanson et al. ......... 438/596 |
| 2006/0115934 A1 | 6/2006 | Kim et al. |
| 2006/0134873 A1 * | 6/2006 | Koontz ..................... 438/301 |
| 2007/0161216 A1 | 7/2007 | Bauer |
| 2008/0026516 A1 | 1/2008 | Chakravarti et al. |
| 2008/0142862 A1 * | 6/2008 | Liao et al. ................ 257/303 |

OTHER PUBLICATIONS

International Search Report and Written Opinion for PCT/US2009/035287, (Aug. 28, 2009), 10 pgs.

* cited by examiner

*Primary Examiner*—Tuan N. Quach
(74) *Attorney, Agent, or Firm*—Diehl Servilla LLC; Scott S. Servilla

(57) ABSTRACT

Methods for forming embedded epitaxial layers containing silicon and carbon are disclosed. Specific embodiments pertain to the formation embedded epitaxial layers containing silicon and carbon on silicon wafers. In specific embodiments an epitaxial layer of silicon and carbon is non-selectively formed on a substrate or silicon wafer, portions of this layer are removed to expose the underlying substrate or silicon wafer, and an epitaxial layer containing silicon is formed on the exposed substrate or silicon wafers. In specific embodiments, gates are formed on the resulting silicon-containing epitaxial layers.

18 Claims, 2 Drawing Sheets

METHOD OF FORMING AN EMBEDDED SILICON CARBON EPITAXIAL LAYER

TECHNICAL FIELD

Embodiments of the invention generally relate to the field of electronic manufacturing processes and devices, more particular, to methods of depositing silicon-containing films while forming electronic devices.

BACKGROUND

Typically, a Metal Oxide Semiconductor (MOS) transistor includes a semiconductor substrate, a source, a drain, and a channel positioned between the source and drain on the substrate, which is usually made from silicon. Normally, a gate stack is located above the channel, the gate stack being composed of a gate oxide layer or gate electrode located directly above the channel, a gate conductor material above the gate oxide layer or gate dielectric, and sidewall spacers. The sidewall spacers protect the sidewalls of the gate conductor. The gate electrode is generally formed of doped polysilicon (Si) while the gate dielectric material may comprise a thin layer (e.g., <20 Å) of a high dielectric constant material (e.g., a dielectric constant greater than 4.0) such as silicon dioxide ($SiO_2$) or nitrogen-doped silicon dioxide, and the like.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers. The carbon-doped silicon epitaxial layers can be deposited on the source/drain of nMOS and pMOS transistors, respectively. The source and drain areas can be either flat or recessed. When properly fabricated, nMOS sources and drains covered with carbon-doped silicon epitaxy imposes tensile stress in the channel and increases nMOS drive current.

To achieve enhanced electron mobility in the channel of nMOS transistors having a recessed source/drain using carbon-doped silicon epitaxy, typical processes include selectively forming the carbon-doped silicon epitaxial layer on the source/drain. In such processes, it is desirable for the carbon-doped silicon epitaxial layer to contain substitutional C atoms to induce tensile strain in the channel. Higher channel tensile strain can be achieved with increased substitutional C content in a carbon-doped silicon source and drain. However, most of C atoms incorporated through typical selective Si:C epitaxy processes (for example at process temperature >700° C.) occupy non-substitutional (i.e. interstitial) sites of the Si lattice. By lowering growth temperature, a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures. Further, such processes encounter difficulty achieving desired selectivity.

Therefore, there is a need to provide methods to improve the substitutional carbon content in carbon-doped silicon epitaxial layers and the growth rate and selectivity of forming such layers.

SUMMARY

One aspect of the invention pertains to a process for forming embedded silicon carbon epitaxy layer on a substrate which includes placing a substrate into a process chamber; non-selectively depositing a silicon carbon epitaxial layer on the substrate by exposing the substrate to deposition gas comprising a silicon source, a carbon source and a carrier gas; and removing portions of the silicon carbon layer to form well regions in the silicon carbon layer which expose a portion of the substrate. A further aspect of the invention includes depositing a silicon-containing epitaxial layer in the well regions on the exposed portion of the substrate and forming one or more gates over the well regions on the silicon-containing epitaxial layer.

In an embodiment of the invention, the substrate is a silicon wafer. The gates of one or more embodiments include gate dielectrics and gate electrodes.

A hardmask is formed over portions of the silicon carbon layer and the exposed areas which are not covered by the hardmask are removed using lithography and etching in some embodiments. According a particular embodiment, the hardmask can comprise silicon oxide or silicon nitride.

In an embodiment, deposition of the silicon-containing epitaxial layer occurs by selective deposition. In a further embodiment, the hardmask is removed after the silicon-containing epitaxial layer is selectively deposited in the well regions on the exposed portion of the substrate. After removal of the hardmask but prior to forming the one or more gates, the surface of the selectively deposited silicon-containing epitaxial layer and silicon carbon epitaxial layer is smoothed or evened out by chemo-mechanical polishing.

In at least one embodiment, the silicon-containing epitaxial layer is non-selectively deposited on the substrate after the hardmask is removed. In a further embodiment, the surface of the non-selectively deposited silicon-containing epitaxial layer and silicon carbon epitaxial layer is smoothed by chemo-mechanical polishing prior to forming the one or more gates on the silicon-containing epitaxial layer In accordance with another aspect of the present invention, a process for forming an embedded silicon carbon epitaxy layer on a silicon wafer includes placing a silicon wafer into a process chamber; non-selectively depositing a silicon carbon epitaxial layer on the silicon wafer by exposing the substrate to deposition gas comprising a silicon source, a carbon source and a carrier gas; providing well regions by etching portions of the silicon carbon layer to expose the silicon wafer; and depositing a silicon-containing epitaxial layer in the well regions and on the exposed silicon wafer; and forming one or more gates on the silicon-containing epitaxial layer. In one embodiment, the one or more gates include gate dielectrics and gate electrodes. In a further embodiment, the embedded silicon carbon epitaxial layer is formed in a transistor manufacturing process during a fabrication step.

In one or more embodiments, portions of the silicon carbon layer are removed by forming a hardmask over selected portions of the silicon carbon layer and using lithography and etching to remove the exposed or uncovered portions. In one embodiment, the hardmask includes silicon oxide or silicon nitride. In another embodiment, the hardmask is removed before the silicon-containing epitaxial layer is deposited in the well regions by non-selective deposition. The hardmask is removed after the silicon-containing epitaxial layer is deposited in the well regions by selective deposition in further embodiments. In still further embodiments, the surface of the selectively deposited silicon-containing epitaxial layer and silicon carbon epitaxy layer is smoothed by chemo-mechanical polishing prior to forming one or more gates.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
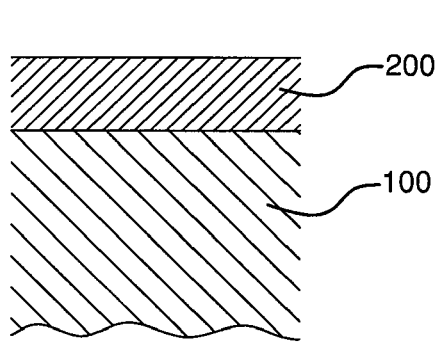
FIG. 1 is a schematic illustration of silicon wafer and a Si:C epitaxial layer deposited thereon.

Before describing several exemplary embodiments of the invention, it is to be understood that the invention is not limited to the details of construction or process steps set forth in the following description. The invention is capable of other embodiments and of being practiced or being carried out in various ways.

Embodiments of the invention generally provide a method of forming an embedded epitaxial layer containing silicon and carbon. Other embodiments pertain to a method of manufacturing a transistor.

In particular embodiments, methods of forming Si:C in source and drain regions of nMOS transistor are provided. In specific embodiments, Si:C epitaxy is formed on the source/drain areas without using selective epitaxy processes. In more specific embodiments, Si:C epitaxy is formed on the source/drain areas using nonselective Si:C epitaxy, followed by lithography and etching and then Si epitaxy.

As used herein, epitaxial deposition and epitaxy refer to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate.

Throughout the application, the terms "silicon-containing" materials, compounds, films or layers should be construed to include a composition containing at least silicon and may contain germanium, carbon, boron, arsenic, phosphorus gallium and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe for silicon germanium, Si:C for silicon carbon and SiGeC for silicon germanium carbon. The abbreviations do not represent chemical equations with stoichiometric relationships, nor represent any particular reduction/oxidation state of the silicon-containing materials.

According to one or more embodiments, the methods follow a sequential order, however, the process is not limited to the exact steps described herein. For example, other process steps can be inserted between steps as long as the order of process sequence is maintained. The individual steps of forming an embedded Si:C epitaxial layer will now be described according to one or more embodiments.

The Substrate

According to one or more embodiments, the substrate is typically a silicon substrate or wafer that is unpatterned. Typically, patterned substrates are substrates that include electronic features formed into or onto the substrate surface. The patterned substrate may contain monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

Non-Selective Si:C Epitaxy Deposition

Referring to FIG. 1, a Si:C epitaxial layer 200 is non-selectively or blanket deposited on a silicon wafer 100. According to one or more embodiments, the Si:C layer may be non-selectively or blanket deposited using an epitaxial process in a suitable processing chamber such as an Epi RP or Centura, both of which are available from Applied Materials, Inc., Santa Clara, Calif. Generally, the process chamber is maintained at a consistent temperature throughout the epitaxial process. However, some steps may be performed at varying temperatures. According to a specific embodiment, the process chamber is kept at a temperature in the range from about 250° C. to about 1,000° C., for example, from about 500° C. to about 900° C. The appropriate temperature to conduct the epitaxial process may depend on the particular precursors used to deposit and/or etch the silicon and carbon-containing materials, and can be determined by a person skilled in the art. In one or more embodiments, the process chamber is usually maintained at a pressure from about 0.1 Torr to about 200 Torr, the pressure may fluctuate during and between this deposition step, but is generally constant.

During the epitaxial deposition process in accordance with one or more embodiments, the substrate is exposed to a deposition gas to form an epitaxial layer on the monocrystalline surface of the substrate. The specific exposure time of the deposition process is determined in relation to the exposure time during the etching process, as well as particular precursors and temperature used in the process. Generally, the substrate is exposed to the deposition gas long enough to form a maximized thickness of an epitaxial layer.

According to one or more embodiments, the deposition gas contains at least a silicon source, a carrier gas, and a carbon source. In an alternative embodiment, the deposition gas may include at least one etchant, such as hydrogen chloride or chlorine.

In one or more embodiments, the silicon source is usually provided into the process chamber at a rate in a range from about 5 sccm to about 500 sccm, for example, from about 10 sccm to about 300 sccm, and specifically from about 50 sccm to about 200 sccm, more specifically, about 100 sccm. Silicon sources useful in the deposition gas to deposit silicon and carbon-containing compounds include, but not limited to, silanes, halogenated silanes and organosilanes. Silanes include silane (SiH4) and higher silanes with the empirical formula $Si_xH(2x+2)$, such as disilane ($Si_2H_6$), trisilane ($Si_3H_8$), and tetrasilane ($Si_4H_{10}$), as well as others. Halogenated silanes include compounds with the empirical formula $X'_ySi_xH(2x+2-y)$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $RySixH(2x+2-y)$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

In one or more embodiments, the silicon source is usually delivered into the process chamber along with a carrier gas. The carrier gas has a flow rate from about 1 slm (standard liters per minute) to about 100 slm, for example, from about 5 slm to about 75 slm, and specifically from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process. Usually the carrier gas is the same throughout each step. However, some embodiments may use different carrier gases in particular steps.

In accordance with one or more embodiments, the carbon source provided to the process chamber during step with the silicon source and carrier gas to form a silicon and carbon-containing compound, such as a silicon carbon material, is usually provided into the process chamber at a rate in the range from about 0.1 sccm to about 20 sccm, for example, from about 0.5 sccm to about 10 sccm, and more specifically from about 1 sccm to about 5 sccm, for example, about 2 sccm. Carbon sources useful to deposit silicon and carbon-containing compounds include, but not limited to, organosilanes, alkyls, alkenes and alkynes of ethyl, propyl and butyl. Such carbon sources include methylsilane (($CH_3$)$SiH_3$), dimethylsilane (($CH_3$)$_2SiH_2$), trimethylsilane (($CH_3$)$_3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 atomic %, for example, from about 1 atomic % to about 3 atomic %, more specifically at least about 2 atomic % or at least about 1.5 atomic %. In one embodiment, the carbon concentration may be graded within an epitaxial layer, preferably graded with a higher carbon concentration in the lower portion of the epitaxial layer than in the upper portion of the epitaxial layer. Alternatively, a germanium source and a carbon source may both be added into the process chamber with the silicon source and carrier gas to form a silicon and carbon-containing compound, such as a silicon germanium carbon material.

Nitrogen is typically a preferred carrier gas due to cost considerations associated with the use of argon and helium as a carrier gas. Despite the fact that nitrogen is generally much less expensive than argon, according to one or more embodiments of the invention, argon is a preferred carrier gas, particularly in embodiments in which methylsilane is a silicon source gas. One drawback that may occur from using nitrogen as a carrier gas is the nitridizing of materials on a substrate during deposition processes. However, high temperature, such as over 800° C., is required to activate nitrogen in such a manner. Therefore, according to one or more embodiments, nitrogen can be used as an inert carrier gas in processes conducted at temperatures below the nitrogen activation threshold. The use of an inert carrier gas has several attributes during a deposition process. For one, an inert carrier gas may increase the deposition rate of the silicon-containing material. While hydrogen may be used as a carrier gas, during the deposition process, hydrogen has a tendency to adsorb or react to the substrate to form hydrogen-terminated surfaces. A hydrogen-terminated surface reacts much slower to epitaxial growth than a bare silicon surface. Therefore, the use of an inert carrier gas increases the deposition rate by not adversely effecting the deposition reaction.

In one example, once the deposition process is terminated, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process is immediately started without purging and/or evacuating the process chamber.

Removal of Portions of Si:C Expitaxy

Figure 2:
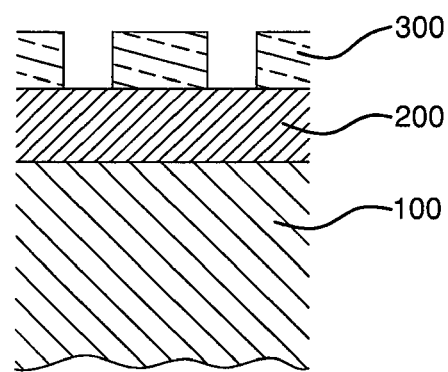
FIG. 2 is a schematic illustration showing formation of dielectric hardmasks on a Si:C epitaxial layer deposited on a silicon wafer according to an embodiment of the invention.
Figure 3:
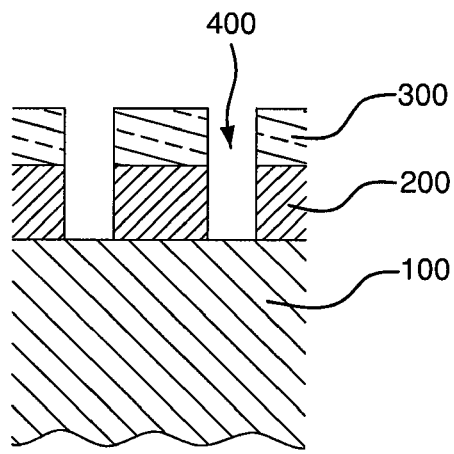
FIG. 3 is a schematic illustration showing formation of pattern openings in the silicon carbon epitaxial layer according to an embodiment of the invention.

In accordance with one or more embodiments of the present invention, portions of the Si:C epitaxial layer are removed to create openings or well regions therein to expose the underlying Si. In one or more embodiments, the portions of the Si:C epitaxial layer can be removed by etching using an etching gas. Examples of etching gas include chlorine-containing gas such as HCl, $Cl_2$ and combinations thereof. In another embodiment, plasma based dry etching is used to remove the Si:C epitaxial layer. In a more specific embodiment, patterning techniques known in the art can be used to create openings in the Si:C epitaxial layer. Patterning is discussed in commonly assigned U.S. Pat. No. 6,967,072, issued Nov. 22, 2005, entitled PHOTOLITHOGRAPHY SCHEME USING A SILICON CONTAINING RESIST and commonly assigned U.S. Pat. No. 6,562,544, issued May 13, 2003 entitled METHOD AND APPARATUS FOR IMPROVING ACCURACY IN PHOTOLITHOGRAPHIC PROCESSING OF SUBSTRATES, which are herein incorporated by reference to the extent they do not conflict with the current specification and claims. In one or more embodiments, lithography techniques are used to pattern the Si:C epitaxial layer. In more specific embodiments, silicon oxide or silicon nitride photomasks, hardmask or photoresist are used with the patterning process. In a more specific embodiment, dielectric hardmasks are used with the patterning process. Dielectric hardmasks are discussed in commonly assigned U.S. Pat. No. 6,764,958, issued on Jul. 20, 2004, entitled METHOD OF DEPOSITING DIELECTRIC FILMS, which is herein incorporated by reference to the extent it does not conflict with the current specification and claims. Referring to FIG. 2, dielectric hardmasks 300 are formed on select portions of the Si:C epitaxial layer 200, thereby covering those portions of Si:C epitaxial layer. Referring to FIG. 3, the uncovered portions of the Si:C layer 200 are removed by a lithography process and openings or well regions 400 are formed to expose the underlying substrate or silicon wafer 100.

In one or more aspects of the present invention, an epitaxial layer of silicon is deposited in the openings or well regions formed by patterning the Si:C epitaxial layer. According to one or more embodiments, the silicon-containing epitaxial layer is formed by selective deposition. In other embodiments, the silicon-containing epitaxial layer is formed by non-selective or blanket deposition.

Selective Silicon-Containing Epitaxy Deposition

Figure 4A:
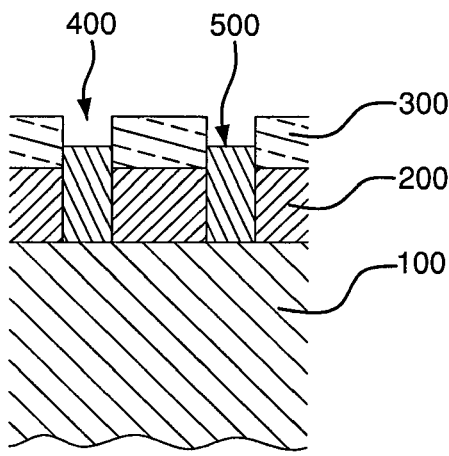
FIGS. 4A-B show formation of a silicon-containing epitaxial layer in the patterned openings of the silicon carbon epitaxial layer according to embodiments of the invention.

In one or more embodiments, photoresist used to pattern the Si:C epitaxial layer is maintained during selective deposition of a silicon-containing epitaxial layer in the openings or well regions of the Si:C epitaxial layer on the exposed portions of the substrate. Without being bound by theory, it is believed that the photoresists, such as a dielectric hardmasks, creates polycrystalline surfaces while the remaining exposed of the Si:C epitaxy, which are not covered by a photoresist, are monocrystalline. Referring to FIG. 4A, the silicon-containing epitaxial layers 500 are deposited in the openings or well regions 400. The portions of the Si:C epitaxial layer 200 covered by the photoresist 300 remain on the silicon wafer 100.

Selective epitaxial deposition permits growth of epilayers on monocrystalline surfaces with no growth on dielectric areas. A typical selective epitaxy process involves a deposition reaction and an etch reaction. During the deposition process, the epitaxial layer is formed on a monocrystalline surface while a polycrystalline layer is deposited on at least a second layer, such as an existing polycrystalline layer and/or an amorphous layer. The deposition and etch reactions occur simultaneously with relatively different reaction rates to an epitaxial layer and to a polycrystalline layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on the spacer.

The epitaxial process, also referred to as the alternating gas supply process, includes repeating a cycle of a deposition process and an etching process until the desired thickness of an epitaxial layer is grown. Exemplary alternating deposition and etch processes are disclosed in commonly assigned and copending U.S. patent application Ser. No. 11/001,774, published as United States Patent Application Publication No. 2006/0115934, entitled, SELECTIVE EPITAXY PROCESS WITH ALTERNATING GAS SUPPLY, the entire content of which is incorporated herein by reference to the extent it does not conflict with the current specification and claims.

In one or more embodiments, the deposition process for forming a silicon-containing epitaxial layer includes exposing the substrate having portions covered by Si:C epitaxial layers and photoresists or dielectric hardmasks to a deposition gas containing at least a silicon source and a carrier gas. In one embodiment, the silicon source and carrier gas used during the blanket deposition of the Si:C epitaxial layer is used to selectively deposit a silicon-containing epitaxial layer in the openings or well regions. Another embodiment utilizes a silicon source to form the silicon-containing epitaxial layer which differs from the silicon source used during the blanket deposition of the Si:C epitaxial layer. The deposition gas may also include a germanium source and/or carbon source, as well as a dopant source. During the deposition process, an epitaxial layer is formed on the monocrystalline surface of the substrate, while a polycrystalline/amorphous layer is formed on secondary surfaces. Subsequently, the substrate is exposed to an etching gas. The etching gas includes a carrier gas and an etchant, such as a chlorine-containing gas. Examples of chlorine-containing gas include chlorine gas, hydrogen chloride or combinations thereof. The etching gas removes silicon-containing materials deposited during the deposition process. During the etching process, the polycrystalline/amorphous layer is removed at a faster rate than the epitaxial layer. Therefore, the net result of the deposition and etching processes forms epitaxially grown silicon-containing material on monocrystalline surfaces while minimizing growth, if any, of polycrystalline/amorphous silicon-containing material on the secondary surfaces. A cycle of the deposition and etching processes may be repeated as needed to obtain the desired thickness of silicon-containing materials. The silicon-containing materials which can be deposited include silicon, silicon germanium, silicon carbon, silicon germanium carbon, and variants thereof, including dopants.

In one example of the process, use of chlorine gas as an etchant lowers the overall process temperature below about 800° C. In general, deposition processes may be conducted at lower temperatures than etching reactions, since etchants often need a high temperature to be activated. For example, silane may be thermally decomposed to deposit silicon at about 500° C. or less, while hydrogen chloride requires an activation temperature of about 700° C. or higher to act as an effective etchant. Therefore, if hydrogen chloride is used during a process, the overall process temperature is dictated by the higher temperature required to activate the etchant. Chlorine contributes to the overall process by reducing the required overall process temperature. Chlorine may be activated at a temperature as low as about 500° C. Therefore, by incorporating chlorine into the process as the etchant, the overall process temperature may be significantly reduced, such as by about 200° C. to 300° C., over processes which use hydrogen chloride as the etchant. Also, chlorine etches silicon-containing materials faster than hydrogen chloride. Therefore, chlorine etchants increase the overall rate of the process.

In accordance with one or more embodiments, the hardmask used to pattern the Si:C epitaxial layer is removed after selective deposition of the silicon-containing epitaxial layer. In a specific embodiment, the hardmask is removed by etching using an etching gas. In one or more embodiments, the hardmask is removed by etching using a plasma-activated fluorocarbon gases. Non-exhaustive examples of suitable fluorocarbon gases include $CHF_3$, $CF_4$, $C_4F_6$, and $C_4F_8$.

Non-Selective Silicon-Containing Epitaxy Deposition

In one or more embodiments, the photoresist or hardmask used to pattern the Si:C epitaxial layer is first removed prior to non-selective deposition of the silicon-containing epitaxial layer, thereby exposing the Si:C epitaxial layer. In a specific embodiment, the hardmask is removed by etching using an etching gas. In a more specific embodiment, the hardmask is removed by etching using a plasma-activated fluorocarbon gases. Non-exhaustive examples of suitable fluorocarbon gases include $CHF_3$, $CF_4$, $C_4F_6$, and $C_4F_8$.

Figure 4B:
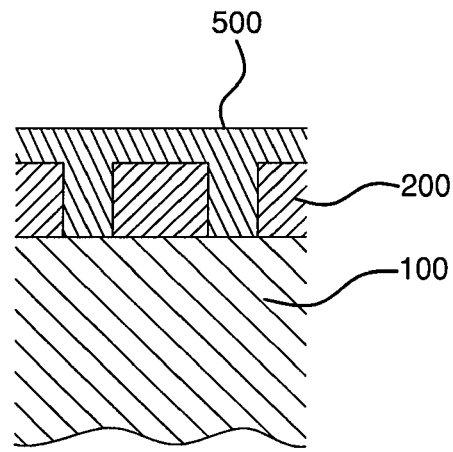

Removal of the hardmask results in a monocrystalline surface. As otherwise discussed, epitaxial layers are formed on monocrystalline surfaces while a polycrystalline layer is deposited on any polycrystalline surfaces. Without being bound by theory, only an epitaxial layer will be formed on the substrate as the hardmask, and therefore the polycrystalline surface, is removed. Referring to FIG. 4B, the silicon-containing epitaxial layer 500 is formed in the openings or well regions of the Si:C epitaxial layer 200 on top of the silicon wafer 100, while the remaining Si:C epitaxial layer 200 remain on the silicon wafer.

In accordance with one embodiment of the invention, a silicon-containing epitaxial layer is non-selectively deposited in the openings or well regions of the Si:C epitaxial layer on the exposed portions of the substrate and on the Si:C epitaxial layer. In a specific embodiment, the silicon-containing epitaxy layer is deposited using the same deposition process used to non-selectively deposit the Si:C epitaxial layer discussed above or other processes known in the art.

Figure 5:
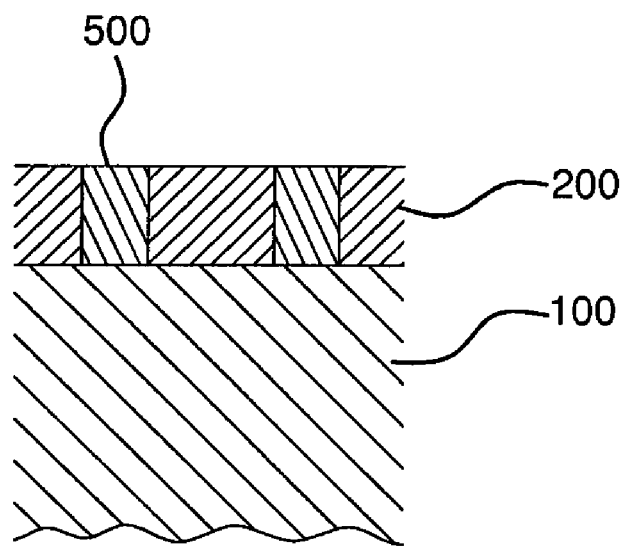
FIG. 5 shows removal excess silicon-containing epitaxy according to embodiments of the invention.

Referring to FIG. 5, the resulting silicon wafer includes portions of Si:C epitaxial layers 200 embedded between the silicon-containing epitaxial layers 500. In one or more embodiments, the surface of the silicon wafer may have a rough or uneven surface, which can be smoothed or evened out using chemo-mechanical polishing (or CMP) processes or other known process in the art prior to the formation of gates. CMP is a process that reduces the uneven buildup of films on the wafer to achieve the smooth, planar surface required for subsequent deposition processing. During CMP, the wafer is held against a rotating flexible pad while an abrasive material, called a slurry, is added to polish, or planarize, the wafer surface. Examples of CMP include the Mirra Mesa system, which uses the Tita Profiler head for excellent center-to-edge polish control, which is available from Applied Materials, Santa Clara, Calif.

Figure 6:
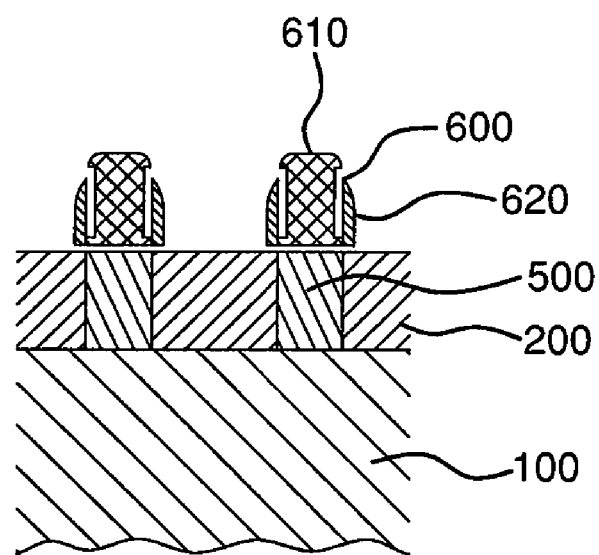
FIG. 6 shows formation of gates on the portions of the device having silicon-containing epitaxial layers deposited thereon according to an embodiment of the invention.

In accordance with other aspects of the invention, one or more gates are formed on the well regions of the silicon-containing epitaxy layer. Referring to FIG. 6, the silicon wafer 100 has Si:C epitaxial layers 200 embedded between the silicon-containing epitaxial layers 500. The Si:C epitaxial layers 200 are exposed, while the silicon-containing epitaxy portions have gates 600 including gate dielectrics 610 and gate electrodes 620 deposited thereon. The formation of the gates can be achieved using any suitable technique known in the art.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A process for forming embedded silicon carbon epitaxy layer on a substrate comprising:
    placing a substrate into a process chamber;
    non-selectively depositing a silicon carbon epitaxial layer on the substrate by exposing the substrate to deposition gas comprising a silicon source, a carbon source and a carrier gas;
    removing portions of the silicon carbon layer to form well regions in the silicon carbon layer which expose a portion of the substrate;
    depositing a silicon-containing epitaxial layer in the well regions on the exposed portion of the substrate; and
    forming one or more gates over the well regions on the silicon-containing epitaxial layer.

2. The process of claim 1, wherein depositing the silicon-containing epitaxial layer includes selectively depositing a silicon-containing epitaxial layer on the exposed portion of the substrate.

3. The process of claim 2, wherein the portions of the silicon carbon layer are removed by forming a hardmask over selected portions of the silicon carbon layer and using lithography and etching.

4. The process of claim 3, wherein the hardmask comprises silicon oxide or silicon nitride.

5. The process of claim 3, wherein the hardmask is removed after selective deposition of the silicon-containing epitaxial layer.

6. The process of claim 1, further comprising smoothing the surface of the silicon-containing epitaxial layer and silicon carbon epitaxial layer by chemo-mechanical polishing prior to forming one or more gates on the silicon-containing epitaxial layer.

7. The process of claim 1, wherein depositing the silicon-containing epitaxial layer includes removing the hardmask and then non-selectively depositing the silicon-containing epitaxial layer.

8. The process of claim 7, further comprising smoothing the surface of the nonselectively deposited silicon-containing epitaxial layer and silicon carbon epitaxial layer by chemo-mechanical polishing prior to forming one or more gates on the silicon-containing epitaxial layer.

9. The process of claim 8, wherein the substrate is a silicon wafer.

10. The process of claim 1, wherein the substrate comprises a silicon wafer and the gates include gate dielectrics and gate electrodes.

11. A process for forming an embedded silicon carbon epitaxy layer on a silicon wafer comprising:
    placing a silicon wafer into a process chamber;
    non-selectively depositing a silicon carbon epitaxial layer on the silicon wafer by exposing the substrate to deposition gas comprising a silicon source, a carbon source and a carrier gas;
    providing well regions by etching portions of the silicon carbon layer to expose the silicon wafer;
    depositing a silicon-containing epitaxial layer in the well regions and on the exposed silicon wafer; and
    forming one or more gates on the silicon-containing epitaxial layer.

12. The process of claim 11, wherein the portions of the silicon carbon layer are removed by forming a hardmask over selected portions of the silicon carbon layer and using lithography and etching.

13. The process of claim 12, wherein the hardmask includes silicon oxide or silicon nitride.

14. The process of claim 12, wherein depositing the silicon-containing epitaxial layer is performed using non-selective deposition and the hardmask is removed before depositing the silicon-containing epitaxial layer.

15. The process of claim 11 further comprising smoothing the surface of the silicon-containing epitaxial layer and silicon carbon epitaxy layer by chemo-mechanical polishing prior to forming one or more gates.

16. The process of claim 11, wherein depositing the silicon-containing epitaxial layer is performed using selective deposition and the hardmask is removed after depositing the silicon-containing epitaxial layer.

17. The process of claim 11, wherein the one or more gates includes gate dielectrics and gate electrodes.

18. The process of claim 11, wherein the embedded silicon carbon epitaxial layer is formed during a fabrication step of a transistor manufacturing process.

* * * * *